United States Patent [19]

Umezaki et al.

[11] 4,288,283

[45] Sep. 8, 1981

[54] METHOD OF FORMING A MICROSCOPIC PATTERN

[75] Inventors: Hiroshi Umezaki, Hachioji; Hideki Nishida, Hinodemachi; Norikazu Tsumita, Kodaira; Hirozi Yamada, Hachioji; Katsuhiro Kaneko, Sayama; Nagatugu Koiso, Tama, all of Japan

[73] Assignee: Hitachi, Ltd., Tokyo, Japan

[21] Appl. No.: 110,445

[22] Filed: Jan. 8, 1980

[30] Foreign Application Priority Data

Jan. 10, 1979 [JP] Japan .................................. 54/714

[51] Int. Cl.³ .............................................. C23F 1/02
[52] U.S. Cl. .................................. 156/643; 156/656; 156/661.1; 156/667; 204/192 E; 427/132; 430/313; 430/318

[58] Field of Search ...................... 365/8, 29; 430/275, 430/276, 323, 327, 496, 524, 950, 5, 327, 311–318, 329; 427/43, 54, 127, 128, 130, 131, 132; 156/643, 646, 654, 655, 656, 659.1, 904, 667, 661.1, 651–653, 657, 662; 204/192 EC, 192 E, 298

[56] References Cited

U.S. PATENT DOCUMENTS

| | | | |
|---|---|---|---|
| 3,720,143 | 3/1973 | Hashimoto et al. | 430/5 |
| 3,884,698 | 5/1975 | Kakihama | 430/276 X |
| 3,949,463 | 4/1976 | Lindmayer et al. | 430/315 X |
| 4,098,917 | 7/1978 | Bullock et al. | 156/643 X |

*Primary Examiner*—William A. Powell
*Attorney, Agent, or Firm*—Birch, Stewart, Kolasch & Birch

[57] ABSTRACT

A method of forming a microscopic pattern wherein the object to be etched is overlaid with a film made of a material which is highly immune to etching and further provided with a reflection reducing film. Thus, the reflection of the irradiating ultraviolet rays by the underlying layer is effectively prevented.

9 Claims, 7 Drawing Figures

METHOD OF FORMING A MICROSCOPIC PATTERN

BACKGROUND AND SUMMARY OF THE INVENTION

1. Field of the Invention

The present invention relates to a method of forming a microscopic pattern. More particularly, the present invention is directed to a method in which a microscopic pattern is formed at high precision by using a film which prevents reflection and a resist film in the etching process.

2. Description of the Prior Art

As is well known, in order to manufacture a magnetic bubble memory device and various semiconductor devices, various kinds of very fine patterns such as transfer patterns and interconnection patterns must be formed at high precision.

Such microscopic patterns are usually formed by the technique called "photolithography."

A photoresist film is deposited on a film to be worked (although the object to be worked is not always a film, it is frequently in the shape of a film), for example, a metal film or an insulator film. A desired part of the photoresist film is irradiated with light (ordinarily, ultraviolet rays are employed) to change the solubility of the irradiated portion. When the photoresist film is of the negative type, the irradiated portion has its solubility decreased and is hardened, whereas when the photoresist film is of the positive type, the irradiated part has its solubility increased and is thereby softened.

When the part of the photoresist film having the increased solubility is subsequently removed (this step is usually called "development"), a pattern of the photoresist is formed. Therefore, when the exposed part of, for example, the metal film is removed by etching, a microscopic pattern made of the metal film is formed.

The development of the photoresist film and the removal of the part to-be-removed of the metal film or the like have utilized wet type developing processes and etching processes employing various liquid developers and etchants. Recently, in order to form a still finer pattern at a still higher precision, various dry etchings have been often adopted instead of the wet type developments and etchings.

In conventional photolithography, however, there has developed the following problem. When the resist film is irradiated by light through a mask, the light is reflected by the underlying layer on which the resist film is deposited. For this reason, also a part of the resist film other than the desired part has its solubility changed due to irradiation by the reflected light. Thus, it is difficult to form a microscopic pattern.

In an attempt to prevent such unfavorable influence by the reflecting light, there have been proposed methods wherein a reflection reducing film is interposed between the film to form the microscopic pattern and the photoresist film, whereupon the exposure is carried out. For example, a method wherein a chromium oxide ($Cr_2O_3$) film is disposed as the reflection reducing film between a permalloy film and the photoresist film has been proposed. Exposure and development are then conducted, and using the resultant pattern of the resist film as a mask, the permalloy film is etched by ion milling. This procedure has been proposed by Shusaku Matsuyama, et al. in "Fabrication of 3 μm Bubble kbit Chips," Japanese Journal of Applied Physics, vol. 16, (1977), September 16, pp. 351–354.

A method wherein a polycrystalline silicon film is deposited between an aluminum film and the photoresist film, and the pattern of the aluminum film is formed by wet etching has been disclosed in Japanese Patent Application Laid-open Specification No. 49-84788 (1974).

In these prior-art methods, however, the $Cr_2O_3$ film and the polycrystalline silicon film employed for the prevention of the reflection are low in immunity against dry etching, so that they are almost useless as a mask in the case of etching the film to form the microscopic pattern. Moreover, the etching of the film to form a microscopic pattern is executed without selectively etching only the reflection reducing film in advance.

For these reasons, dry etching is carried out by employing, in effect, only the pattern of the photoresist as the mask. It is feared that the resist pattern is removed before completion of the step of the dry etching, and it is difficult to precisely form the microscopic pattern.

SUMMARY OF THE INVENTION

An object of the present invention is to solve the problems which are involved in the prior-art photolithographic methods, and to provide a method which can precisely form a microscopic pattern.

Other objects and further scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from the detailed description.

In order to accomplish the objectives of the present invention, the object upon which the microscopic pattern is to be formed, by etching, hereinbelow, simply referred to as "object to-be-etched," is overlaid with a film made of a material which is highly immune to the etching utilized for working of the object to-be-etched and further with a reflection reducing film, whereupon the etching is carried out.

BRIEF DESCRIPTION OF THE DRAWINGS:

The present invention will become more fully understood from the detailed description given hereinbelow and the accompanying drawings which are given by way of illustration only and, thus, are not limitative of the present invention, and wherein, FIGS. 1(*a*) to 1(*f*) are flow diagrams showing an embodiment of the present invention.

DETAILED DESCRIPTION OF THE INVENTION:

The present invention will now be described in detail with reference to the drawings.

FIGS. 1(*a*) to 1(*f*) are schematic sectional views showing the respective steps of a process illustrating an embodiment of the present invention wherein a microscopic pattern of permalloy is formed. Of course, the present invention is not restricted to the formation of the microscopic pattern of permalloy, but it is also applicable to the formation of microscopic patterns of various metals such as aluminum and gold, various insulators such as $SiO_2$, $Al_2O_3$ and $Si_3N_4$, polycrystalline silicon, and the like.

Among them, however, the precise formation of the microscopic pattern with a permalloy film is a technique indispensable for making a transfer pattern and a detector in a magnetic bubble memory device. Therefore, the method of forming the microscopic pattern of the permalloy film will be explained as a typical example of the present invention.

Figure 1A:
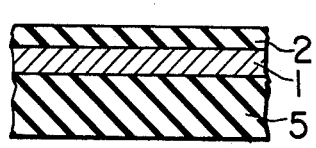

First, as shown in FIG. 1(a), a permalloy film 1 and a titanium (Ti) film 2 are stacked and deposited on the surface of a substrate 5 made of silicon oxide ($SiO_2$).

Figure 1B:
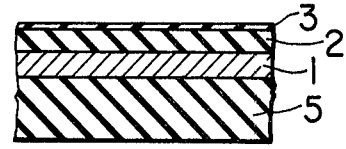

Subsequently, as shown in FIG. 1(b), the surface of the titanium film 2 is oxidized by anodic oxidation so as to form a titanium oxide ($TiO_2$) film 3. By properly setting the conditions of the anodic oxidation in this case so as to make the thickness of the titanium oxide film 3 a predetermined value, the film 3 becomes a reflection reducing film which is effective for light to be used for exposure.

Figure 2:
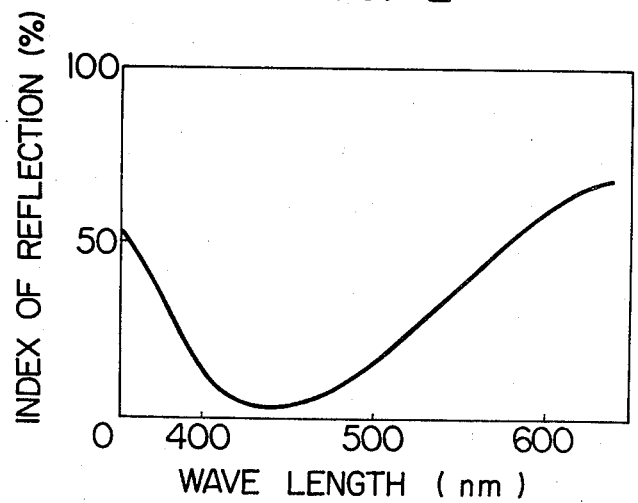
FIG. 2 is a graph showing the effect of the use of a reflection reducing film.

By way of example, in the case where the anodic oxidation is carried out under the conditions of an applied voltage of 25 V and an oxidation time of 30 minutes, a titanium oxide film having a thickness of about 20 $\mu$m is obtained. As illustrated in FIG. 2, this film absorbs light well in the wavelength vicinity of 400–440 nm. Accordingly, ultraviolet light (principal wavelength: 436 nm) the source of which is a mercury-arc lamp is efficiently absorbed. When $TiO_2$ approximately 20 $\mu$m thick is obtained in executing the exposure with the ultraviolet light, it acts very effectively as a reflection reducing film.

Figure 1C:
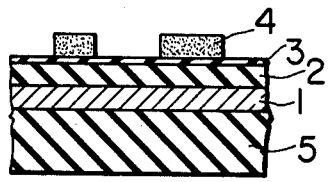

A resist is then applied on the whole surface of the $TiO_2$ film 3. After irradiating a predetermined part of the applied resist film with ultraviolet light whose source is a mercury-arc lamp, development is conducted. Then, a resist pattern 4 is formed as shown in FIG. 1(c). Since, in this case, the titanium oxide film 3 is deposited under the resist film as described above, the reflection of the irradiating ultraviolet rays by the underlying layer is effectively prevented, and the resist pattern 4 is formed at a very high precision.

Figure 1D:
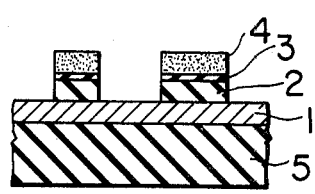

As the next step, using a chemical dry etching, for example, plasma etching employing $CF_4$ gas, the exposed part of the titanium oxide film 3 as well as the titanium film 2 is removed as shown in FIG. 1(d). The etching rate of permalloy or the like in the plasma etching is conspicuously lower than that of titanium or the like. In this step, therefore, the permalloy film 1 is scarcely etched, and only the exposed part of the $TiO_2$ film 3 as well as the Ti film 2 can be selectively etched and removed.

Figure 1E:
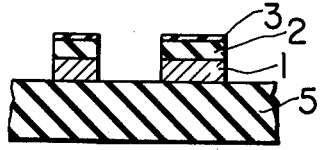

As shown in FIG. 1(e), the exposed part of the permalloy film 1 is removed by a physical dry etching method such as ion etching.

Figure 1F:

Lastly, the titanium oxide film 3 and the titanium film 2 are removed by the aforementioned chemical dry etching. Thus, the microscopic pattern 1 made of permalloy is formed as shown in FIG. 1(f).

Since the step of plasma etching illustrated in FIG. 1(d) is conducted with the resist pattern 4 used as the mask, it is needless to say that also the resist pattern 4 has its thickness considerably reduced by the plasma etching.

Moreover, since the step of the plasma etching is followed by the etching of the exposed part of the permalloy film 1 due to the ion milling as illustrated in FIG. 1(e), the resist pattern 4 is fully removed to expose the $TiO_2$ film 3 in the course of this step. FIG. 1(e) illustrates this state.

As described above, the $TiO_2$ film 3 is very thin, for example, about 20 $\mu$m. In many cases, therefore, the $TiO_2$ film 3 is also removed to expose the surface of the Ti film 2 in the course of which the etching of the permalloy film 1 is being executed by the ion milling.

Since, however, the etching rate of Ti for the ion milling is much lower than that of permalloy, the permalloy film can be etched without the fear of the removal of the titanium film by the ion milling.

In the prior-art methods, the film to form the microscopic pattern is directly overlaid with the reflection reducing film without using any film which corresponds to the Ti film 2.

It has therefore been feared that not only the resist pattern but also the reflection reducing film would be fully removed in the course of the etching step, and that even a part of the microscopic pattern which ought to completely remain, would be etched. In order to prevent the occurrence of such an unfavorable phenomenon, it has been necessary to strictly observe the thicknesses and etching conditions of the respective films, etc. For such reasons, it has been in actuality very difficult to precisely form a microscopic pattern with the prior-art method.

In contrast, in the present invention, the Ti film functions as a mask in the case of etching the permalloy film by ion milling, and hence, even when the resist pattern and the reflection reducing film have been completely etched and removed, there is no feat at all that the permalloy film underlying the Ti film will be etched.

Therefore, the job allowance in the case of actually forming the microscopic pattern is very great. By way of example, a microscopic permalloy pattern having a line width of about 2 $\mu$m and a gap of about 1 $\mu$m can be formed very easily at a high reproducibility.

In the present invention, the $TiO_2$ film 3 is formed as the reflection reducing film on the Ti film 2 serving as the mask in the case of etching the permalloy film 1 by ion milling, and the resist film is deposited thereon, whereupon exposure is carried out. Therefore, the light reflection is effectively prevented, and an excellent microscopic resist pattern is formed.

More specifically, with the prior-art method employing no reflection-reducing film, it has been difficult to form at high reproducibility a microscopic resist pattern having a line spacing of 1 $\mu$m. In contrast, according to the present invention, such microscopic resist pattern can be formed at high reproducibility, with ease and at high precision.

Due to the effect of such reflection reducing film and the effect of the film executing the masking in the ion milling as previously explained, the present invention has made it possible to form an extremely fine pattern at high precision.

Moreover, in order to form the reflection reducing film, the surface of the film to execute the masking may be lightly oxidized by anodic oxidation or the like. Therefore, the method of the present invention is much easier than the conventional method of forming a reflection reducing film using the CVD (chemical vapor deposition) or sputtering method.

The reflection reducing film can also be formed in such a way that a metal oxide is deposited on the surface by evaporation or that after sticking a solution of a metal salt onto the surface, the resultant structure is baked. However, the method wherein after the film to effect the masking has been deposited on the surface of the object to-be-etched, its surface is oxidized by treating it by means of anodic oxidation or by lightly heating it in an oxidizing atmosphere is the easiest and the most effective method in practical use.

In the present invention, the film to effect the masking can be made of any one of various materials which, in etching the object to-be-etched, are sufficiently immune against etching and which can be selectively etched by employing the resist film as the mask.

As regards the materials meeting such conditions, when the object to-be-etched is etched by physical dry etching (the dry etching such as ion milling, in which the object to-be-etched is etched by physical impacts based on particles or ions) as in the case of, for example, permalloy, various metals which are highly immune against the physical dry etching include Ta (tantalum), Mo (molybdenum), Cr (chromium), W (tungsten), Ni (nickel) etc. can be employed besides the aforementioned material Ti.

On the other hand, when the object to-be-etched is made of a material which is etched by chemical dry etching (such as plasma etching, in which not only the mere physical collisions of particles but also a chemical action is involved) as in the case of, for example, an $SiO_2$ film, it is a matter of course that the material of the film to effect the masking is selected from among materials which are highly immune to chemical dry etching.

As apparent from the above description, the present invention comprises a film which serves as a mask in the etching process, a reflection reducing film and a photoresist film stacked and deposited on the object to-be-etched, whereupon the exposure, development and etching are carried out. Therefore, the influence of the reflection in the exposure is prevented, and a very fine photoresist pattern is formed. Furthermore, the disappearance of the photoresist pattern and the underlying reflection-reducing film in the case of the etching has no influence, so that the job allowance is very great and a very fine pattern can be stably formed at high precision.

In addition, according to the present invention, the reflection reducing film can be formed merely by lightly oxidizing the surface of the film for masking by an appropriate means such as anodic oxidation, and hence, it can be formed much more readily than in the conventional method.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method of forming a microscopic pattern, comprising the steps of:
   (a) depositing a film to effect masking onto an object to-be-etched,
   (b) forming a reflection reducing film on said film to effect masking,
   (c) depositing a photoresist film onto said reflection reducing film,
   (d) forming a photoresist pattern by irradiating a desired portion of said photoresist film with light and thereafter conducing development,
   (e) removing the exposed part of said reflection reducing film and the masking film which is disposed underneath said exposed portion, by employing said photoresist pattern as a mask, and
   (f) removing the exposed part of said object to-be-etched.

2. The method of forming a microscopic pattern according to claim 1, wherein the removal of said object to-be-etched is performed by a dry etching, and said film to effect masking is made of a material substantially immune against said dry etching.

3. The method of forming a microscopic pattern according to claim 1, wherein said reflection reducing film is formed by oxidizing a surface of said film to effect masking.

4. The method of forming a microscopic pattern according to claim 3, wherein the oxidation is performed by anodic oxidation or heating in an oxidizing atmosphere.

5. The method of forming a microscopic pattern according to claim 1, wherein the removal of said object to-be-etched is performed by physical dry etching, and said film to effect masking is selected from the group consisting of films substantially immune against said physical dry etching.

6. The method of forming a microscopic pattern according to claim 5, wherein said object to-be-etched is a permalloy film, and said film to effect masking is made of a material selected from the group consisting of Ti, Ta, Mo, Cr, W and Ni.

7. The method of forming a microscopic pattern according to claim 6, wherein said film to effect masking is made of Ti, and said reflection reducing film is $TiO_2$ film which has a thickness of about 20 $\mu$m.

8. The method of forming a microscopic pattern according to claim 1 wherein the reflection reducing film is formed by depositing a metal oxide on the surface of the film to effect masking.

9. The method of forming a microscopic pattern according to claim 1 wherein after the removal of the exposed part of said object to-be-etched, the remaining portions of the film to effect masking and the reflection reducing film are removed to form said microscopic pattern.

* * * * *